(12) United States Patent
Truong et al.

(10) Patent No.: US 6,563,716 B1
(45) Date of Patent: May 13, 2003

(54) HEAT SINK CLIP WITH PRESSING CAM

(75) Inventors: Phu Truong, Stanton, CA (US);
Rong-Che Chen, Irvine, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/242,349

(22) Filed: Sep. 11, 2002

(51) Int. Cl.[7] .................................................. H05K 9/00
(52) U.S. Cl. ........................ 361/816; 361/704; 439/330
(58) Field of Search ................................ 361/704, 707, 361/709, 710, 715, 719–721, 816, 818; 165/80.3, 185; 439/73, 330, 331, 487

(56) References Cited

U.S. PATENT DOCUMENTS

| | | | | |
|---|---|---|---|---|
| 6,061,239 A | * | 5/2000 | Blomquist | 361/704 |
| 6,181,559 B1 | * | 1/2001 | Seo | 361/704 |
| 6,201,697 B1 | * | 3/2001 | McCullough | 361/704 |
| 6,421,242 B1 | * | 7/2002 | Chen | 361/704 |
| 6,430,051 B1 | * | 8/2002 | Yang et al. | 361/704 |

FOREIGN PATENT DOCUMENTS

TW        398641        7/2000

* cited by examiner

*Primary Examiner*—David Martin
*Assistant Examiner*—Thanh S. Phan
(74) *Attorney, Agent, or Firm*—Wei Te Chung

(57) ABSTRACT

A heat sink clip assembly for attaching a heat sink (30) to a CPU (20) that is mounted to a mother board (10). A heat sink clip includes a first bar (62), a second bar (80) slidably attached to the bar, and a handle (90) pivotably attached to the first bar. Two legs (68, 84) respectively depend from opposite ends of the first and second bars. Two tabs (69, 86) extend inwardly from the legs, each tab defining a slot (74, 88). The handle has a shaft (92) and a pressing cam (94). A back plate (40) is placed under the under the mother board. Two post (50) are successively extended through the back plate, the mother board, and the heat sink. The post are then engaged in the slots of the clip. When the shaft is rotated downwardly, the pressing cam presses against the heat sink.

8 Claims, 4 Drawing Sheets

HEAT SINK CLIP WITH PRESSING CAM

BACKGROUND OF THE INVENTION

1. Field of the Invention

The present invention relates to means for securing heat sinks, and particularly to a heat sink clip for attaching a heat sink to an electronic device such as a computer electronic package.

2. Related Art

Developments in integrated circuits have resulted in greater circuit density and complexity, thus increasing heat generated by operation of such integrated circuits within an electronic package. Therefore, bigger and heavier heat sinks are becoming increasingly necessary to efficiently remove the heat. Thermal interface material (TIM) is usually applied onto the electronic package where it contacts the heat sink. TIMs are pressure sensitive. When a large heat sink is attached to an electronic package by, say clips, the retaining force applied by the clips must be uniform. Otherwise, the TIM will not function efficiently.

Nowadays, strong resilient clips are often used to attach heavy heat sinks onto electronic packages. The force required to keep a heat sink in place is correspondingly large. Operators or end users must exert great manual force when attaching a retainer clip to a socket or to a motherboard. Extra tools are often required for installation or removal of the clip. There is considerable risk that during use of such tools, nearby components such as the motherboard itself will be accidentally damaged.

Therefore, an improved heat sink clip which overcomes the above-mentioned problems is desired.

BRIEF SUMMARY OF THE INVENTION

Accordingly, an object of the present invention is to provide a heat sink clip for readily attaching a heat sink to an electronic device such as a central processing unit (CPU), and for readily detaching the heat sink therefrom.

Another object of the present invention is to provide a heat sink clip which does not need extra tools in assembly or disassembly.

A further object of the present invention is to provide a heat sink clip which resists movement of the clip and an associated heat sink when they are subjected to vibration or shock.

To achieve the above-mentioned objects, a heat sink clip assembly in accordance with the present invention attaches a heat sink to a CPU that is mounted to a mother board. A heat sink clip in accordance with a preferred embodiment of the present invention comprises a first bar, a second bar slidably attached to the first bar, and a handle pivotably attached to the first bar. Two legs respectively depend from opposite ends of the first and second bars. Two tabs extend inwardly from the legs, each tab defining a slot. The handle has a shaft and a pressing cam. A back plate is placed under the mother board. Two posts are successively extended through bores of the back plate, apertures of the mother board, and holes of the heat sink. The posts are then engaged in the slots of the clip. When the shaft is rotated downwardly, the pressing cam presses against the heat sink, and the first and second bars resiliently deform upwardly. The clip thus secures the heat sink to the CPU.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
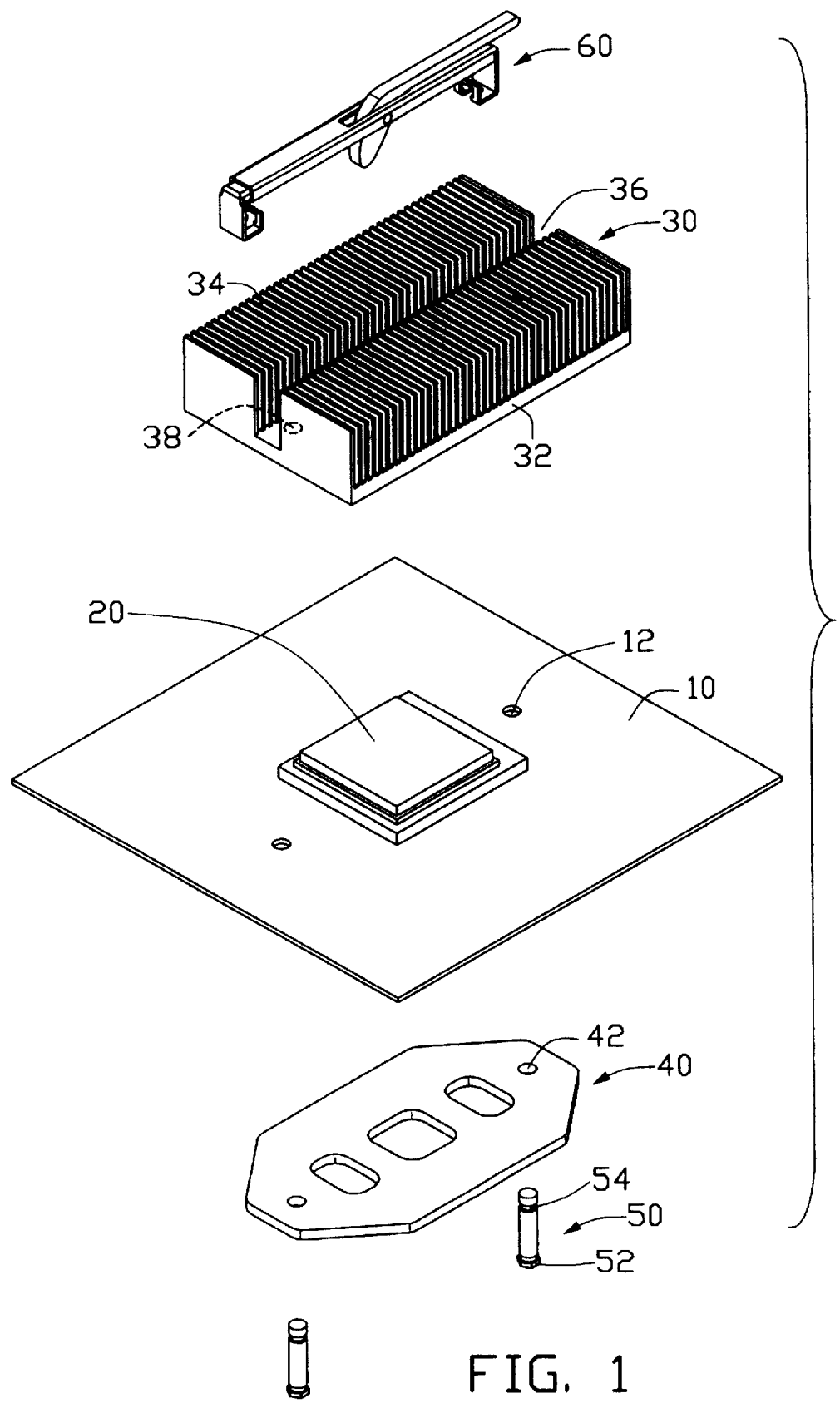
FIG. 1 is an exploded isometric view of a heat sink clip assembly in accordance with a preferred embodiment of the present invention, together with a heat sink, and a CPU mounted on a mother board.

Referring to FIG. 1, a heat sink clip assembly in accordance with the present invention is used to attach a heat sink 30 to a CPU 20 that is mounted on a mother board 10.

The mother board 10 defines two through apertures 12 at opposite sides of the CPU 20 respectively. The heat sink 30 comprises a base 32, and a plurality of parallel fins 34 extending upwardly from the base 32. A channel 36 is transversely defined through a center of the fins 34. Two spaced through holes 38 (only one labeled) are defined in the base 32, in communication with the channel 36.

A heat sink clip assembly in accordance with a preferred embodiment of the present invention comprises a back plate 40, two posts 50, and a heat sink clip 60. Two bores 42 are defined in opposite ends of the back plate 40 respectively, corresponding to the through holes 38 of the heat sink 30. Each post 50 comprises a head 52 at one end thereof, and an annular groove 54 defined in an opposite locking end thereof. Diameters of the through apertures 12 of the mother board 10, the through holes 38 of the heat sink 30, and the bores 42 of the back plate 40 are all the same. A diameter of each post 50 is slightly less than the diameter of each bore 42 of the back plate 40. A diameter of the head 52 of each post 50 is greater than the diameter of each bore 42 of the back plate 40, so that the head 52 cannot enter the corresponding bore 42.

Figure 2:
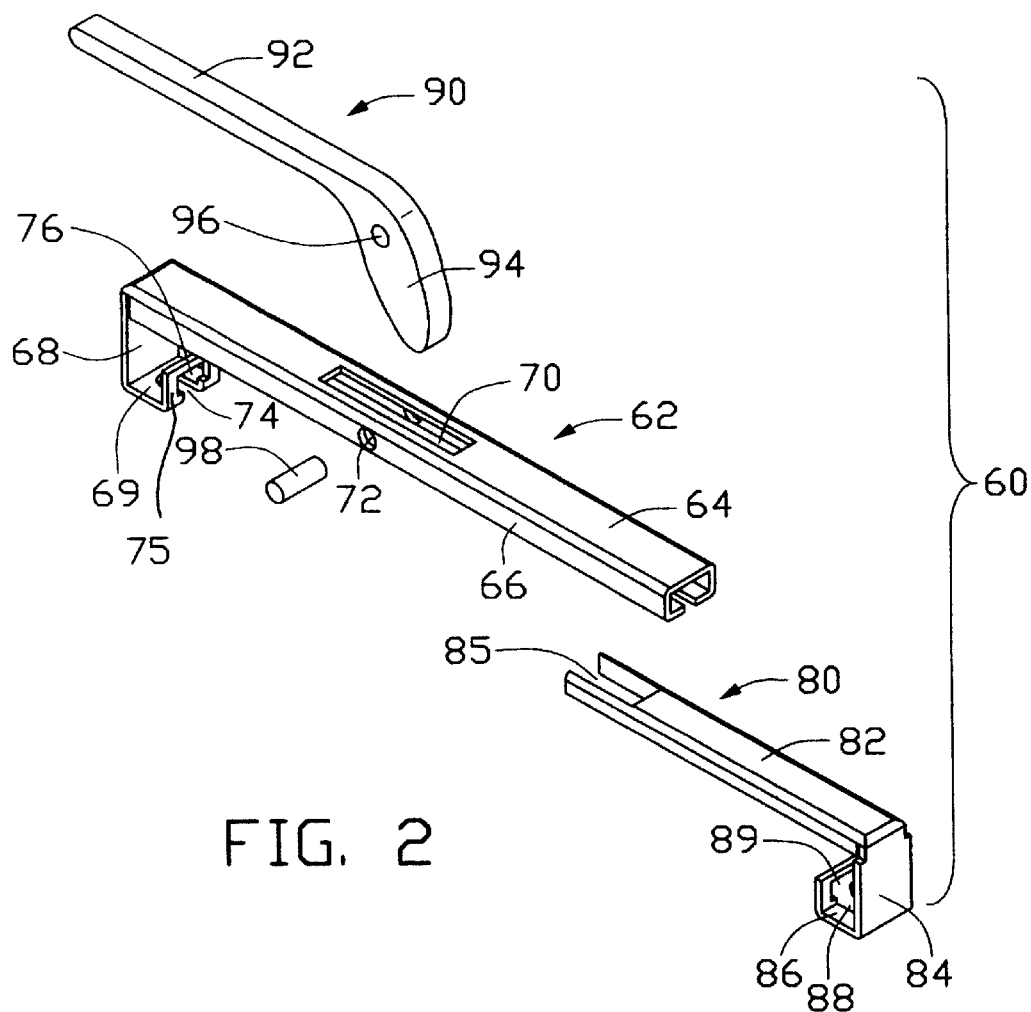
FIG. 2 is an enlarged exploded isometric view of a heat sink clip of the heat sink clip assembly of FIG. 1, viewed from another aspect.

Referring also to FIG. 2, the clip 60 comprises a first bar 62, a second bar 80 and a handle 90. The first bar 62 comprises a first horizontal plate 64, and two side plates 66 depending from opposite longitudinal sides of the first horizontal plate 64 respectively. Each of the side plates 66 has an L-shaped profile. The first horizontal plate 64 and side plates 66 cooperatively define a space (not labeled) therebetween. A first leg 68 depends from one end of the first horizontal plate 64. A first tab 69 extends inwardly and then upwardly from a distal end of the first leg 68. An oblong opening 70 is defined in a middle of the first horizontal plate 64. A pair of coaxial fixing holes 72 is respectively defined in the side plates 66 at opposite sides of the opening 70. A first slot 74 is defined in a horizontal portion of the first tab 69 and an adjacent part of a vertical portion of the first tab 69. A first entrance 76 is defined in the vertical portion 75 of the first tab 69, above and in communication with the first slot 74. The first entrance 76 is wider than the first slot 74.

The second bar 80 comprises a second horizontal plate 82, and a second leg 84 depending from an end of the second horizontal plate 82 that is distal from the first leg 68 of the first bar 62. A cutout 85 is defined in an opposite end of the second horizontal plate 82. A second tab 86 extends inwardly and then upwardly from a distal end of the second leg 84. A second slot 88 is defined in a horizontal portion of the second tab 86 and an adjacent part of a vertical portion of the second tab 86. A second entrance 89 is defined in the vertical portion of the second tab 86, above and in communication with the second slot 88. The second entrance 89 is wider than the second slot 88.

The handle 90 comprises a shaft 92, and a pressing cam 94 at one end of the shaft 92. A fixing aperture 96 is defined in the vicinity of a junction of the shaft 92 and the pressing cam 94. A pin 98 is for insertion into the fixing holes 72 of the first bar 62 and the fixing aperture 96 of the handle 90.

Figure 3:
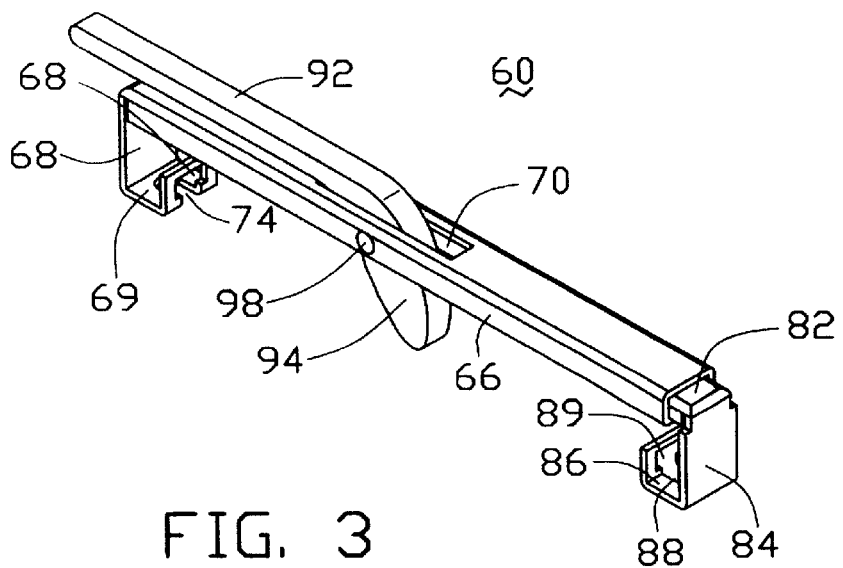
FIG. 3 is an assembled view of the clip of FIG. 2.

Referring also to FIG. 3, in assembly of the clip 60, the second horizontal plate 82 of the second bar 80 is inserted into the space defined between the first horizontal plate 84 and side plates 66 of the first bar 62. The pressing cam 94 of the handle 90 is extended into the opening 70 of the first bar 62 and the cutout 85 of the second bar 80. The fixing aperture 96 of the handle 90 is aligned with the fixing holes 72 of the side plates 66 of the first bar 62. The pin 98 is extended into the fixing holes 72 and the fixing aperture 96, thereby pivotably attaching the handle 90 to the first bar 62. When the shaft 92 is oriented substantially horizontally, a vertical displacement of a distal end of the pressing cam 94 of the handle 90 from the pin 98 is greatest.

Figure 4:
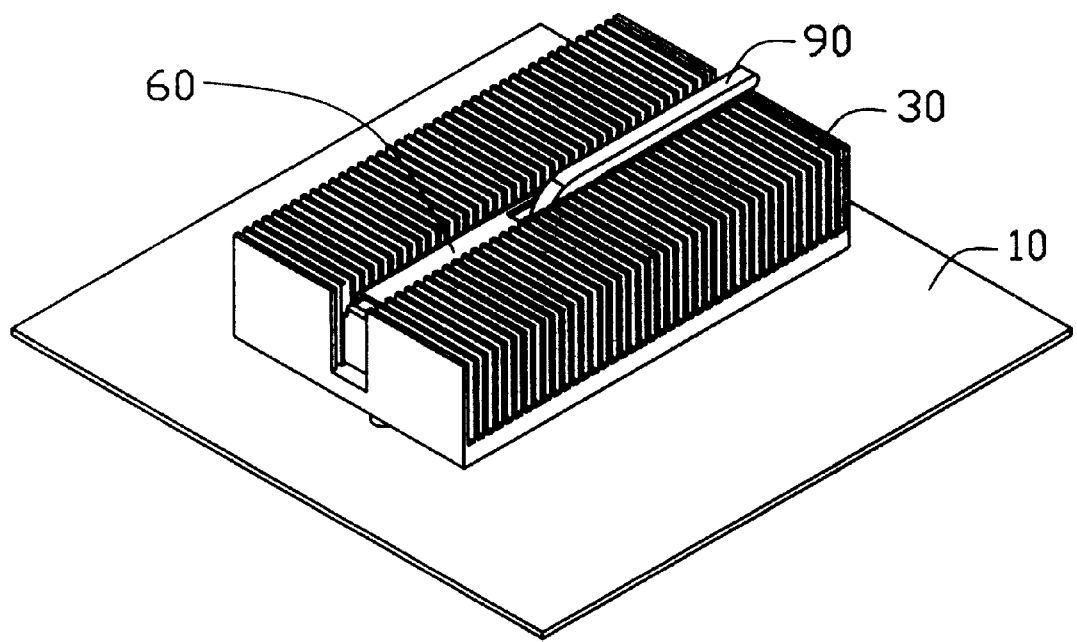
FIG. 4 is an assembled view of FIG. 1, showing the heat sink clip assembly attaching the heat sink onto the CPU.

Referring to FIG. 4, in use of the heat sink clip assembly, the CPU 20 is mounted on the mother board 10. The heat sink 30 is placed onto a top surface of the CPU 20, with the through holes 38 of the heat sink 30 respectively aligning with the through apertures 12 of the mother board 10. The back plate 40 is placed against a bottom surface of the mother board 10. The posts 50 are successively extended through the bores 42 of the back plate 40, the through apertures 12 of the mother board 10, and the through holes 38 of the heat sink 30. The clip 60 is placed in the channel 36 of the heat sink 30. The first and second tabs 69, 86 are positioned outwardly from and adjacent the respective posts 50. In this unlocked position, the shaft 92 of the handle 90 is upright (not shown). Then the first and second legs 68, 84 are pushed toward each other, so that said opposite ends of the posts 50 pass through the respective entrances 76, 89 of the first and second tabs 69, 86, wherein the axial dimension of the groove 54 of the post 50 is not less than the vertical dimension of the slot 74 in the vertical portion 75 of the first tab 69 so as to allow lateral movement of the post 50 around the groove 54 through the slot 74 in the vertical portion 75. The first and second tabs 69, 86 are thus engaged in the grooves 54 of the posts 50 at the first and second slots 74, 88 respectively. The shaft 92 is rotated downwardly. The pressing cam 94 presses against an upper surface of the base 32 of the heat sink 30. This causes both the first and second bars 62, 80 to resiliently rise, thereby ensuring that the pressing cam 94 firmly presses the heat sink 30 onto the CPU 20. The shaft 92 is continued to be rotated until the distal end of the pressing cam 94 has passed a point of greatest vertical displacement, and a pressing point of the pressing cam 94 is near said distal end. This ensures that the pressing cam 94 remains stably in position.

Removal of the clip 60 is essentially a reverse of the above-described procedure. The shaft 92 of the handle 90 is rotated upwardly to release the pressing cam 94 from pressing engagement with the heat sink 30. The first and second bars 62, 80 of the clip 60 are pulled outwardly until the first and second tabs 69, 86 are disengaged from the corresponding posts 50. The clip 60 is then easily taken out from the heat sink 30.

Figure 5:
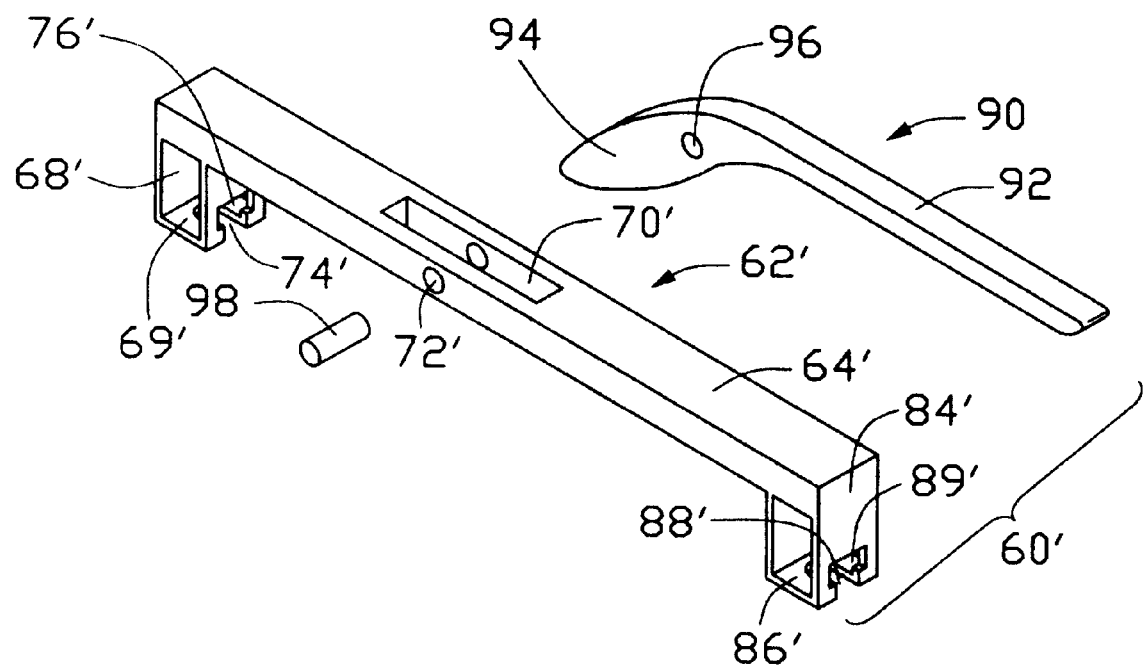
FIG. 5 is an exploded isometric view of a heat sink clip in accordance with an alternative embodiment of the present invention.

A heat sink clip 60' in accordance with an alternative embodiment of the present invention is shown in FIG. 5. The clip 60' comprises a single main body 62', and a handle 90. The handle 90 is the same as that described above in relation to the preferred embodiment. The main body 62' comprises a bar 64', and first and second legs 68', 84' depending from opposite ends of the bar 64' respectively. An oblong opening 70' is defined through a middle portion of the bar 64'. A pair of coaxial fixing holes 72' is respectively defined in side walls of the bar 64' at opposite sides of the opening 70'. A pin 98 is for insertion into the fixing holes 72' of the bar 64' and the fixing aperture 96 of the handle 90. Each of the legs 68', 84' is generally parallelepiped-shaped. A first slot 74' is defined in a bottom wall 69' of the first leg 68' and an adjacent part of an inner side wall of the first leg 68'. A first entrance 76' is defined in the inner side wall of the first leg 68', above and in communication with the first slot 74'. The first entrance 76' is wider than the first slot 74'.

A second slot 88' is defined in a bottom wall 86' of the second leg 84' and an adjacent part of an outer side wall of the second leg 84'. A second entrance 89' is defined in the outer side wall of the second leg 84', above and in communication with the second slot 88'. The second entrance 89' is wider than the second slot 88'.

Assembly of the clip 60' is the substantially the same as that described above in relation to the clip 60 of the preferred embodiment, with due alteration of details. In use of the heat sink clip assembly, reference is made to FIG. 1 regarding the heat sink 30, mother board 10, back plate 40 and posts 50. The two posts 50 are successively extended through the bores 42 of the back plate 40, the through apertures 12 of the mother board 10, and the through holes 38 of the heat sink 30. The clip 60' is placed in the channel 36 of the heat sink 30. The first leg 68' is positioned outwardly from and adjacent one of the posts 50. The second leg 84' is positioned inwardly from and adjacent the other post 50. In this unlocked position, the shaft 92 of the handle 90 is upright. Then the first and second legs 68', 84' are pushed toward the posts 50, so that the top ends of the posts 50 pass through the respective entrances 76', 89' of the first and second legs 68', 84'. The first and second legs 68', 84' are thus engaged in the grooves 54 of the posts 50 at the first and second slots 74', 88' respectively.

It is noted that one feature of the invention is to provide the vertical portion 75 of the tab 69 to formed a receiving cavity/nest among the leg 68 and the tab 69 for retaining the locking end of the post 50 therein without possibility of withdrawal therefrom along the slot 74 due to obstacle of the vertical portion 75, when the clip 60 is in a locked position. Generally, the combination of the leg 68 and the tab 69 may only require to form a horizontal portion to lift the locking end of the post and a vertical portion to prevent disengagement of the locking end of the post from the horizontal portion, when the clip is in the locked/tension position.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clip assembly, comprising:
    a first unit defining two spaced through apertures therein;
    a second unit attached to a top face of the first unit, the second unit having a base and a channel above the base, two through holes being defined in the base at the channel;
    a clip received in the channel of the second unit, the clip having:

an elongate main body and two legs respectively depending from opposite ends of the main body, a slot being defined in each of the legs; and a handle pivotably attached to the main body and comprising a pressing cam; and two posts successively extending through the through apertures of the first unit and the through holes of the second unit, each of the posts having a head at a bottom end thereof abutting a bottom surface of the first unit, and a groove at an upper end thereof, the posts engaging in the slots of the legs, wherein the legs of the clip are movable along a longitudinal direction of the main body, the posts slidingly engage in corresponding slots of the clip, and when the handle is rotated the cam presses against the base of the second unit toward the first unit.

2. The clip assembly as described in claim 1, further comprising an electronic unit mounted to the first unit between the through apertures.

3. The clip assembly as described in claim 1, wherein the first unit is a circuit substrate, and the second unit is a heat sink.

4. The clip assembly as described in claim 1, wherein each of the slots is defined in a horizontal portion of the corresponding leg, each of the legs defines an entrance in communication with a corresponding slot, the entrances facing a same direction that is along a longitudinal direction of the elongate main body.

5. The clip assembly as described in claim 1, wherein each of the slots has a width less than a diameter of either of the posts, and slightly greater than a diameter of either of the posts at the corresponding annular groove.

6. The clip assembly as described in claim 1, wherein an opening is defined in the main body of the clip, the opening receiving a part of the handle therein.

7. A method for attaching a heat sink to an electronic device, the method comprising the steps of:

providing a circuit substrate having two through apertures defined therein;

mounting the electronic device on the circuit substrate between the through apertures;

placing the heat sink onto the electronic device, the heat sink defining a channel and two through holes therein;

placing a clip in the channel of the heat sink, the clip having an elongate main body, and a handle pivotably attached to the main body, wherein two legs depend from opposite ends of the main body, a slot is defined in each of the legs, and the handle has a pressing cam;

extending two posts successively through the through apertures of the circuit substrate and the through holes of the heat sink, each of the posts having a head and an annular groove spaced from the head, wherein the legs of the clip are positioned adjacent the posts at the annular grooves;

moving the legs of the clip along a direction of the elongate main body so that the posts are engagingly received in the slots of the legs at the annular grooves;

rotating the handle so that the pressing cam presses against the heat sink, thereby resiliently attaching the heat sink to the electronic device.

8. The method as described in claim 7, wherein the main body of the clip is integrally formed, and the clip is pushed in one direction so that the posts are engagingly received in the slots of the legs.

\* \* \* \* \*